United States Patent [19]

Elderkin

[11] 4,090,664
[45] May 23, 1978

[54] TRI-STATE ELECTRICAL CIRCUIT

[75] Inventor: Patrick John Elderkin, Wellingborough, England

[73] Assignee: Johnson & Starley Limited, England

[21] Appl. No.: 684,840

[22] Filed: May 10, 1976

[30] Foreign Application Priority Data

May 13, 1975 United Kingdom ............... 20199/75

[51] Int. Cl.² ............................................. G05B 11/28
[52] U.S. Cl. .................................... 236/11; 236/78 D; 318/599; 361/203
[58] Field of Search ..................... 236/75, 78 D, 78 A, 236/11; 307/276, 313, 288; 251/129; 318/341, 596, 599; 361/203

[56] References Cited

U.S. PATENT DOCUMENTS

| | | | |
|---|---|---|---|
| 3,149,293 | 9/1964 | Farkas | 307/313 X |
| 3,470,892 | 10/1969 | Barker | 361/203 X |
| 3,726,473 | 4/1973 | Sapir | 236/11 |
| 3,735,148 | 5/1973 | Sapir | 236/11 UX |
| 3,870,931 | 3/1975 | Myers | 318/599 |

Primary Examiner—William E. Wayner
Attorney, Agent, or Firm—Roylance, Abrams, Berdo & Farley

[57] ABSTRACT

An electrical circuit having three states depending upon the magnitude of an electrical signal coupled, in operation, to an input thereof, the circuit having a first stable state when the said magnitude is less than a first, predetermined value, a second, stable state when the said magnitude is greater than a second, predetermined value higher than the first said predetermined value, and a third, unstable state when said magnitude is equal to or between said first and second predetermined values. In a development of the invention, the circuit is incorporated in a control apparatus for a ducted, warm-air, central-heating system in which the gas supply to a burner is supplied continuously when the temperature of a space to be heated is below a predetermined temperature, is cut-off when the temperature of the space is above another, higher predetermined temperature, and is switched on and off at a rate dependent upon the magnitude of the temperature when it is equal to or between the two values.

33 Claims, 6 Drawing Figures

TRI-STATE ELECTRICAL CIRCUIT

BACKGROUND OF THE INVENTION

This invention relates to an electrical circuit having three different states depending upon the magnitude of an electrical input signal coupled to its input.

Such a circuit will have many applications, and one application for which it is suitable is as part of a control apparatus for a domestic, gas-fired, warm-air central heating system in which air is heated by passing it over a heat exchanger and then passed along a duct, or ducts, to the space or spaces to be heated.

SUMMARY OF THE INVENTION

According to the invention there is provided an electrical circuit having three states depending upon the magnitude of an electrical quantity coupled, in operation, to an input thereof, the circuit having a first stable state when the said magnitude is less than a first, predetermined value, a second, stable state when the said magnitude is greater than a second, predetermined value higher than the first said predetermined value, and a third, unstable state when said magnitude is equal to or between said first and second predetermined values.

The circuit may include a semi-conductor device arranged to conduct current continuously in one of its stable states, to be substantially non-conductive in the other of its stable states and to oscillate between a conductive state and a substantially non-conductive state in its third, unstable state.

Preferably the circuit according to the last preceding paragraph is so arranged that when it is in the third, unstable state the ratio of the time it is in the conductive state to the time it is in the substantially non-conductive state is dependent upon the magnitude of the input electrical quantity.

The circuit may have an output for connection to a load, such as a relay, arranged to be energised continuously and de-energised when the circuit is in one and the other of the first and second states respectively, and to be energised intermittently when the circuit is in the third state.

Preferably the circuit comprises two transistors of opposite conductivity type wherein a first transistor has its collector coupled to the base of the second transistor and the collector of the second transistor is coupled to the base of the first transistor by way of a feedback network for determining the period of oscillation of the circuit when it is in the third, unstable state. Both of the transistors are arranged to be "on" that is conductive in one of the stable states and to be "off", that is substantially non-conductive, in the other of the stable states. A load, such as a relay, may be coupled between the collector of the second transistor and its collector supply voltage. In the case of a relay, or like load, the second transistor is substantially non-conductive when the magnitude of the current therethrough is insufficient to energise the relay, or like load.

Preferably, the circuit is so arranged that both the transistors are not completely saturated when in the conductive state.

The input of the circuit is preferably the base of the first transistor.

In an embodiment comprising a first NPN transistor and a second PNP transistor and the input signal is a d.c. voltage applied to the base of the first transistor by way of a resistor, both transistors will be "on" when the magnitude of the input voltage is greater than a first predetermined value and both transistors will be "off" when the magnitude is less than a second predetermined value lower than the first said value. When the magnitude of the input voltage is equal to or between the first and second predetermined values the transistors are switched "on" and "off" continuously. The feedback network between the collector of the seccond transistor and the base of the first transistor may comprise a capacitor and resistor in series, and have values which determine the period of oscillation in the third state of the circuit. The mark-space ratio (ratio of the length of time the transistors are "on" to the length of time the transistors are "off") of the circuit in the third state is dependent upon the magnitude of the input voltage, increasing as the said magnitude increases. The feedback network may comprise a further circuit, such as a second capacitance-resistance circuit in parallel with the first mentioned capacitance-resistance circuit, to supplement the first circuit when the input voltage is equal to or between the first and second predetermined values to ensure that the circuit remains in its unstable state, at the two extreme ends of the controlled mark/space ratio state of oscillation.

While the input signal is a voltage coupled to the base of the first transistor by way of a resistor (that is a current into the base) it can be derived from other electrical quantities, such as a variable resistance.

The input signal is preferably applied to the input of the circuit according to the invention by way of a buffer amplifier. The sign of the input signal will depend upon the design of the circuit.

A circuit according to the invention may find application, inter alia, as part of a control apparatus for controlling a variety of parameters such as temperature, and the circuit may be arranged to form part of a servo control system.

Thus according to a development of the invention, there is provided control apparatus for controlling the amount of heat generated by a gas heater according to the temperature of an object or a space to be heated, the apparatus comprising a circuit according to the invention having its output coupled to a gas control means for controlling the supply of gas to a burner, and its input coupled to means for monitoring the said temperature and for providing an input signal of such magnitude that when the temperature is less than a first predetermined value, the circuit causes the gas control means to supply gas continuously to the burner, when the temperature is more than a second predetermined value higher than the first said predetermined value, the circuit causes the gas control means to stop the supply of gas to the burner, and when the temperature is equal to or between the said two predetermined values, the circuit causes the gas control means to supply gas to the burner intermittently and at a rate dependent upon the magnitude of the temperature.

The means for monitoring the temperature may be a device, such as a thermistor, the resistance of which varies with temperature, or a thermocouple, the output voltage of which varies with temperature.

The control apparatus may be arranged to control the amount of heat generated in a central-heating system by monitoring the ambient temperature of a space to be heated.

Advantageously the control apparatus is used with a warm-air central-heating system in which air is passed-over a heat exchanger where it is heated and then passed through ducts to be discharged into a space or spaces to be heated. It is usual to provide a fan to assist the flow of warm air, and in a still further development of the invention, the operation of the fan is controlled further to improve the effectiveness of the central-heating system.

Control apparatus currently fitted to domestic, gas-fired, warm-air central-heating systems may have operating characteristics which do not produce optimum comfort to the occupants of a room or rooms to be heated, particularly when the warm air is discharged into rooms at a low level. When the rooms are at or about a predetermined temperature, selected by a room thermostat for example, and the apparatus is operative to maintain the temperature constant within predetermined limits, the delivered air fluctuates in temperature in response to intermittent burner operation and its flow is periodically interrupted. This intermittent operation can give rise to discomfort in a heated room because of temperature swings, intermittent air currents and intermittent fan noise.

In the said further development, the control apparatus comprises means for controlling the speed of the fan motor to control the volume of air passed over a heat exchanger and delivered to the space or spaces to be heated in dependence upon the temperature at a predetermined position in the system, thereby to maintain the temperature in the space, or spaces substantially more constant.

The fan motor may be controlled by apparatus according to the invention disclosed in our United Kingdom application No. 20200/75 entitled "Apparatus for controlling the speed of a motor".

Thus the control apparatus may comprise apparatus for controlling the speed of rotation of an electric fan motor in dependence upon the magnitude of a temperature at a predetermined position in the system, the apparatus comprising an analogue to digital converter having an input for receiving an analogue input signal dependent on the temperature and an output coupled to an input of a motor control means which is arranged, in operation, periodically to decode the digital output of the converter and to control the speed of rotation of the motor in dependence thereon.

Means may be provided for periodically resetting the output of the analogue to digital converter to a datum value and for inhibiting change in operation of the motor control means during a conversion period.

The analogue to digital converter may comprise an analogue to time interval converter arranged to generate an output signal having a time duration dependent upon the magnitude of the input signal, and means coupled to the output of the analogue to time interval converter for causing clock pulses to be counted by a counter for the duration of said output signal. Thus the count in the counter at the termination of the output signal from the converter, that is at the end of a conversion period, is dependent upon the magnitude of the input signal and therefore the temperature. The count is then decoded by the motor control means.

The analogue to time interval converter may comprise a ramp generator for generating a ramp output signal which varies at a substantially constant rate during a conversion period and means for comparing the magnitudes of the ramp signal and the input signal, or a signal derived from the input signal, and for generating a comparison signal when the two compared signals balance out, and the means coupled to the output of the analogue to time interval converter is arranged to cause pulses to be counted during a time interval starting when said ramp signal is equal to a datum value and terminating with the generation of the comparison signal.

Preferably, the ramp generator is a staircase generator.

The staircase generator may comprise a resistor and capacitor connected in series to a source of a.c. potential whereby the potential across the capacitor increases in a stepwise fashion as it is charged by alternate half cycles of current from the a.c. source, the half cycles being obtained by way of a diode.

Preferably means is provided for discharging the capacitor to a datum level at the start of each conversion period.

The means for comparing may be a bistable circuit arranged to be set to one state at the start of a conversion period and reset by the comparison signal.

The clock pulse generator may be a switching device, such as a transistor, arranged to be switched on and off at a constant rate when the bistable is set. Thus the clock pulse generator will provide one or more pulses and the number of pulses generated will be dependent upon the length of time the bistable circuit is set.

Preferably, the switching device is switched on and off by an alternating signal, for example a signal alternating at line frequency.

The pulses may be coupled to the counter by way of pulse shaping means.

The motor control means may comprise a plurality of latching circuits coupled to the outputs of the counter and arranged to vary the energisation to the electric motor according to the weighting of its associated counter stage. Thus for a four-stage binary counter the four outputs thereof would be representative of counts 1, 2, 4 and 8 respectively and the associated latching circuits could be arranged to vary the power supplied to the motor by corresponding amounts.

In a preferred embodiment of the invention comprising a four-stage binary counter and four corresponding latching circuits coupled to the outputs thereof, four resistors having weightings R, 2R, 4R and 8R are connected in series with the alternating current supply to a motor. Each resistor has a normally-open relay contact connected across it, and the relay contacts are controlled by relay coils energised by corresponding latching circuits, for example the third counter stage is coupled to the third latching circuit which controls operation of the relay contact across the resistor of value 4R.

The motor control means may further include means responsive to the input signal for inhibiting operation of the motor when the magnitude of the input signals is less than a predetermined value.

Sampling means may be provided for controlling the periodic operations of the apparatus, such as the discharge of the capacitor in the staircase generator, the decoding operation of the motor control means and the resetting of the analogue to digital converter.

Preferably the sampling means is synchronised to a predetermined point on the waveform of the line frequency.

Preferably the temperature is measured at or near to the heat exchanger.

The temperature may be measured by a device, such as a thermistor whose resistance varies with temperature, or a thermocouple, the output voltage of which varies with temperature.

In another aspect the control apparatus may comprise apparatus for controlling the speed of rotation of an electric motor, in dependence upon the value of a thermistor connected in the input circuit of an oscillator including a unijunction transistor, in which the oscillator is coupled to a power supply having an alternating component in such a way that the unijunction transistor is fired on a particular part of the alternating component of the supply determined by the magnitude of the resistance of said thermistor, and the output of the oscillator is coupled to the gate of a thyristor or triac having one electrode coupled to one side of an alternating current supply and its other electrode coupled through the motor to the other side of the supply, whereby the point on the a.c. waveform at which the thyristor or triac is fired is determined by the output of the oscillator.

Thus the power supplied to the motor by the thyristor or triac, and hence the speed of the fan motor, is dependent upon the magnitude of the said resistance, and therefore temperature.

Preferably the output of the oscillator is coupled to the said gate by way of a pulse transformer.

Thus a control apparatus embodying a circuit according to the invention can be designed to provide better comfort by delivering air substantially continuously at almost constant temperature and matching its volume to the heat load. Thus temperature swings in heated rooms can be much reduced, air currents are continuous, satisfactorily slow and always of adequate temperature and fan noise is low and continuous. This can be achieved by controlling the fuel input in shorter time cycles and by controlling the fan speed according to heat exchanger temperature.

DESCRIPTION OF THE DRAWINGS

The invention will now be described by way of example with reference to the accompanying drawings, in which.

DETAILED DESCRIPTION OF THE DRAWINGS

Figure 1:
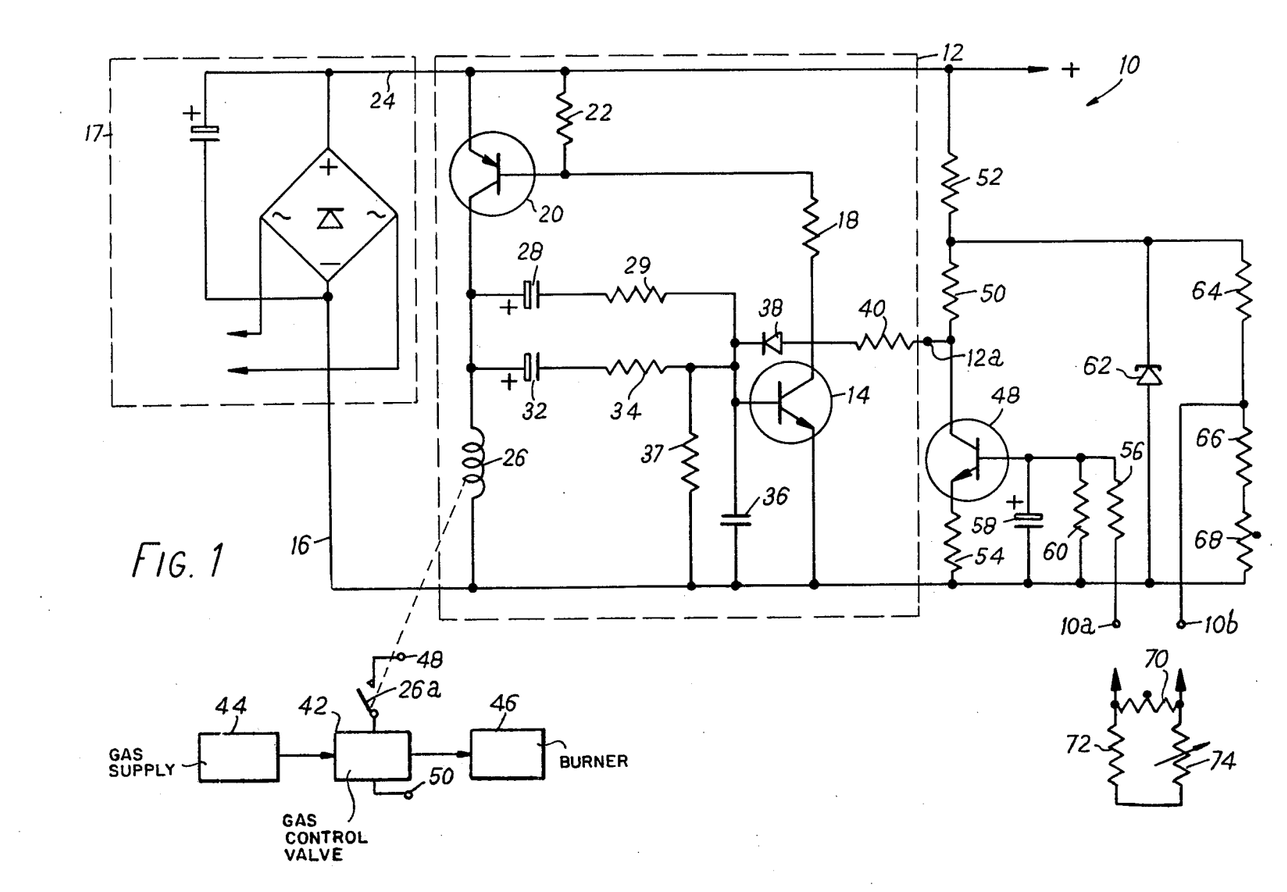
FIG. 1 shows a circuit diagram of a circuit according to the invention arranged to control the flow of gas to a burner in a domestic, warm-air, gas-fired central heating system.

Referring to FIG. 1, there is shown a control circuit 10 for controlling the supply of gas to a gas burner 46. The control circuit 10 comprises a circuit shown within a broken line 12 having three states depending upon the magnitude of the potential at its input 12a.

The circuit 12 comprises a first, NPN transistor 14 having its emitter connected to a zero volt rail 16 of a power supply shown within a broken line 17, and its collector coupled through a resistor 18 to the base of a second, PNP transistor 20 and through a resistor 22 to a +30 volt rail 24. The transistor 20 has its emitter connected to the +30 volt rail 24 and its collector coupled through a relay coil 26 to the zero volt rail 16. The collector of transistor 20 is also coupled to the base of transistor 14 through a basic timing control circuit comprising a capacitor 28 and resistor 29 in series and through a secondary timing control circuit comprising a capacitor 32 and resistor 34. The two timing control circuits are connected in parallel as shown.

The base of the transistor 14 is coupled through a capacitor 36 and resistor 37 connected in parallel to the zero volt rail 16 and through a diode 38 poled as shown and a resistor 40 to the input 12a.

When the potential at the input 12a is above a first predetermined value the resulting current into the base of transistor 14 turns on the transistor 14 and the reduction in its collector voltage turns on transistor 20 so that the emitter-collector current of transistor 20 energises relay 26. Relay 26 has a pair of normally-open contacts 26a arranged when closed to energise a gas control valve 42 connected in line between a gas supply 44 and the gas burner 46. A 24 volt a.c. power supply for the gas valve 42 is connected to terminals 48 and 50.

The values of resistors 18 and 22 are so chosen that transistor 20 is caused to operate on a part-linear section of its operating curve to ensure that it is not fully saturated when it is on.

When the potential at the input 12a is less than a second predetermined value, lower than the first said predetermined value, the relatively low potential at the base of transistor 14 cuts-off the transistor and the resulting relatively high potential at its collector cuts-off transistor 20 as well so that relay 26 is de-energised to cut-off the supply of gas to the burner 46.

When the potential at the input 12a is equal to or between the said first and second predetermined values the potential at the base of transistor 14 is such that the circuit operates as an astable circuit with both transistors being alternately on and off together. The mark-space ratio, the ratio of the time the transistors are both on, to the time they are both off, is determined by the magnitude of the potential applied to the input 12a, that is the mark-space ratio increases as the potential approaches the said first value.

The values of the capacitor 28 and resistor 29 are so chosen that in the third state the circuit oscillates with a total cycle time (mark + space) of about 2.5 minutes, and the circuit 12 is so arranged that it is in the third, oscillatory state when the magnitude of the input is between about 10% and 90% of its dynamic range. The input 12a is coupled to the collector of a transistor 48, which collector is also coupled through resistors 50, 52 in series to the positive rail 24. The transistor 48 has its emitter coupled through a gain-setting resistor 54 to the zero volt rail 16 and its base coupled through a resistor 56 to an input terminal 10a. The base of transistor 48 is also coupled through a capacitor 58 and a resistor 60 connected in parallel to the zero volt rail 16.

Coupled between the junction of resistor 50 with resistor 52 and the zero volt rail 16 is a 22 volt zener diode 62, the resistor 52 and zener diode 62 acting as a voltage regulator. Connected across the zener diode 62 is a series circuit consisting of resistors 64 and 66 and a thermistor 68. The thermistor 68 provides some temperature compensation for the circuit as the ambient temperature for the circuit may vary considerably, for example if the central heating system is switched off for long periods during the day or night. The junction of resistor 64 with resistor 66 is connected to a second input terminal 10b.

A temperature sensing circuit comprising a thermistor 70 connected in parallel with a series arrangement of a resistor 72 and a variable resistor 74 is connected to the input terminals 10a and 10b. The temperature sensing circuit is situated in a convenient position in a room to be heated and the resistor 74 can be adjusted to select the temperature of the room.

The capacitor 58 is provided to de-couple unwanted a.c. signals from the base of the transistor 48 and the value of resistor 60 is preset to control the temperature control range of the apparatus.

The capacitor 32 and resistor 34 are not essential but are provided to ensure extended on and off conditions of the circuit 12 when the input potential is greater than the first predetermined value and less than the second predetermined value respectively. The capacitor 36 is provided to prevent spurious triggering of the circuit 12 and the diode 38 is provided to prevent current flowing from capacitor 28 and resistor 29 to the collector circuit of transistor 48 when the collector of transistor 20 is more positive than that of transistor 48.

In operation, when the temperature at the temperature sensing circuit in a room to be heated is much lower than the selected control temperature set by resistor 74, the resistance of thermistor 70 is high and the potential at input terminal 10a is low so that transistor 48 is cut-off. Thus the potential at the collector of transistor 48 is greater than a first predetermined value and both transistors 14 and 20 are rendered conducting. The relay 26 is energised to open the gas valve and the burner 46 operates continuously. As the temperature in the room increases the resistance of the thermistor 70 decreases and the consequent increase in current fed to the base of transistor 48 causes it to conduct and the potential at its collector (input 12a) drops to a value equal to or less than the said first predetermined value when the circuit 12 starts to oscillate as described as aforesaid. The circuit 12 oscillates with a cycle time of about 2.5 minutes set by capacitor 28 and resistor 29 and with a mark-space ratio determined by the magnitude of the potential at the input 12a. That is, when the temperature is such that the potential at the input 12a is equal to or just greater than the first predetermined value the transistors 14 and 20 are on almost continuously but as the temperature increases towards a second higher predetermined value the resultant reduction in value of the potential at input 12a reduces the mark-space ratio accordingly. When the temperature exceeds the second, predetermined value the potential at input 12a is such that the transistors 14 and 20 are cut-off continuously. Thus when the temperature is less than the first predetermined value the relay 26 is energised and the burner 46 operates continuously. When the temperature is equal to or between the first and second predetermined values set by the temperature sensing circuit the relay 26 and the burner are operated intermittently so that the amount of heat generated is sufficient to maintain the temperature of the room between these two values. If the temperature exceeds the second predetermined value the relay is de-energised and the burner extinguished. The circuit 12 is so arranged that it is in its third, oscillatory, state for between about 10% to 90% of the design heat load requirement of the heated space.

In the circuit as described, if inputs 10a and 10b are connected together the transistor 48 will be turned on and gas will be supplied continuously to the gas burner 46.

Figure 5:
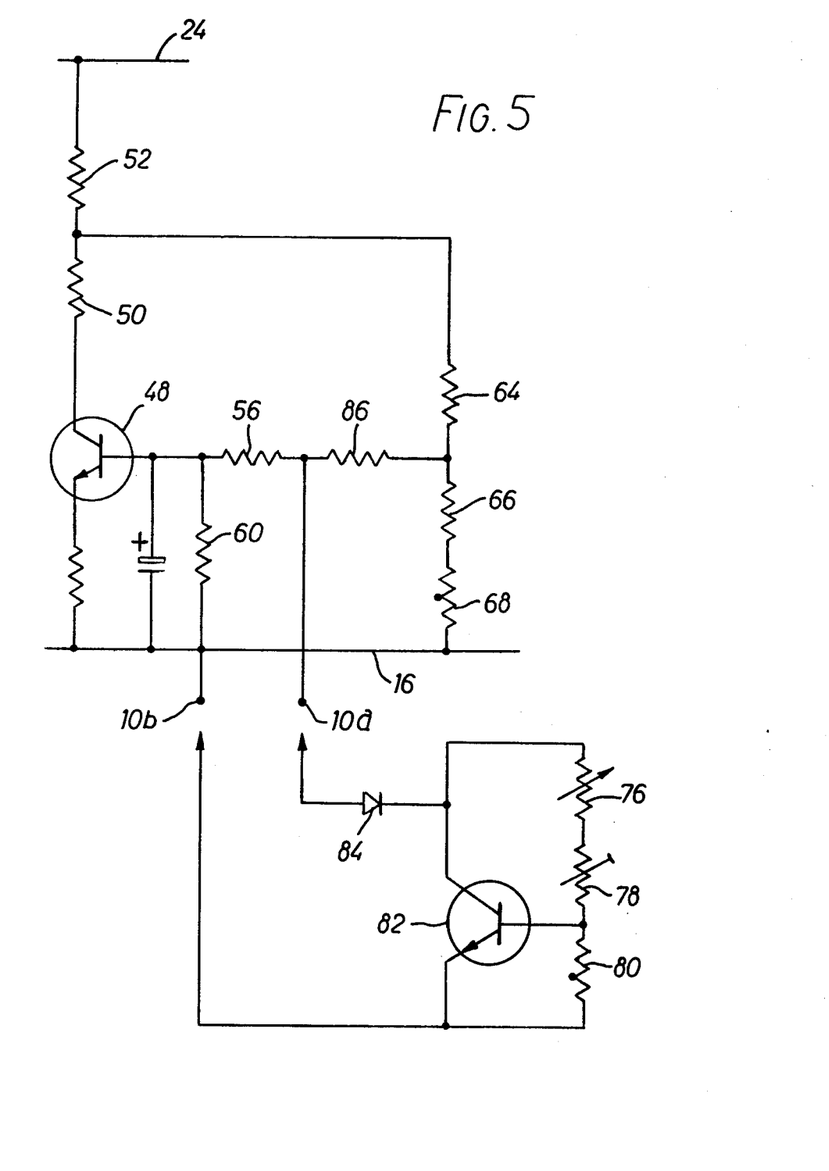
FIG. 5 shows a modification to the circuit of FIG. 1.

FIG. 5 shows a part of the circuit of FIG. 1 modified to provide a fail-safe feature. In this arrangement the temperature-sensing circuit comprises a negative temperature coefficient thermistor 80, a temperature setpoint control resistor 76, a calibration control resistor 78, an NPN transistor 82 and a silicon diode 84 connected as shown.

With this configuration the transistor 82 operates as an amplifier and inverter so that as the ambient temperature around the negative temperature-coefficient thermistor 80 rises, the potential at the base of the transistor 82 fails tending to turn-off the transistor 82, resulting in an increase in its collector voltage. The resulting increase in collector potential is applied by way of diode 84 and resistor 56 to the base of transistor 48 which decreases the "on" to "off" time of timer circuit 12 thus reducing the amount of gas supplied to the gas burner 46 to maintain the ambient temperature at the required value.

Figure 2:
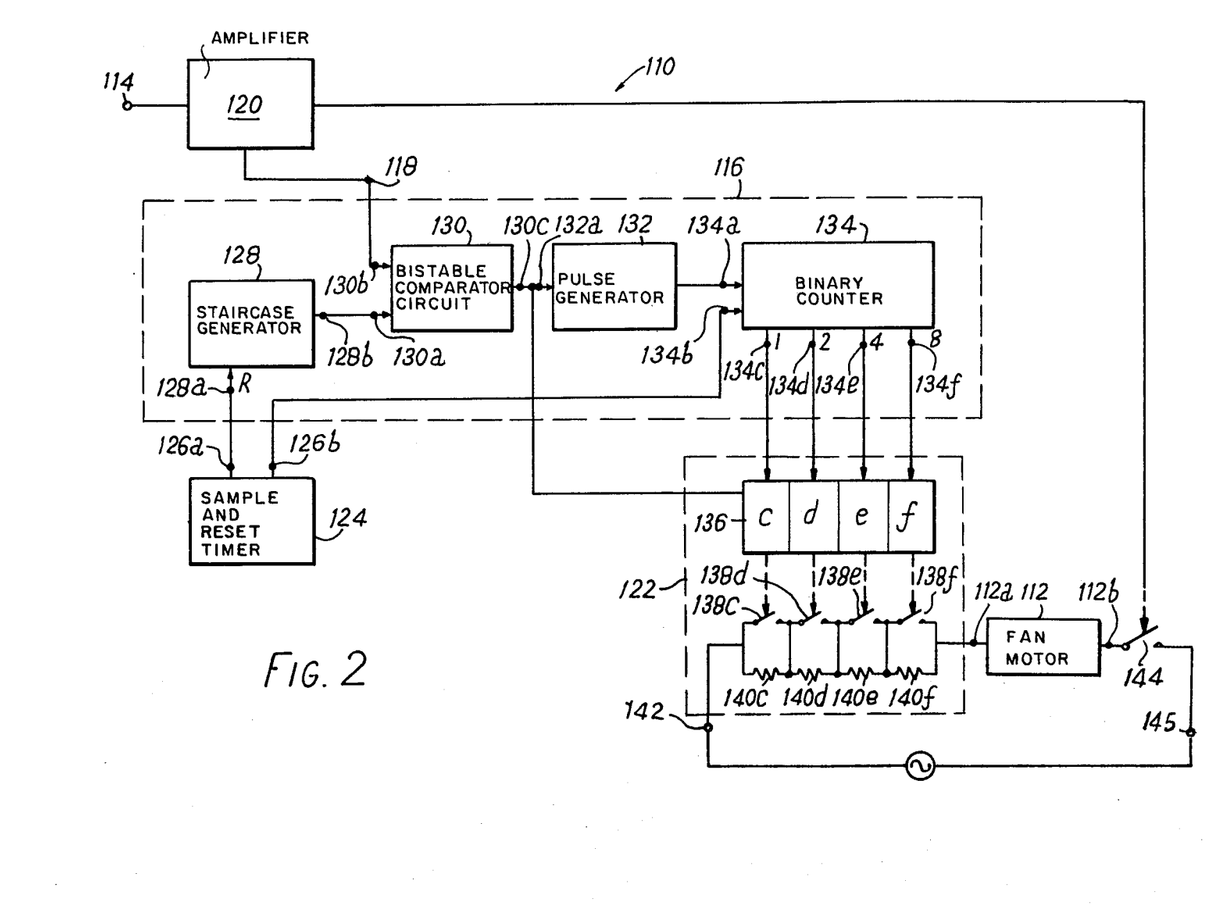
FIG. 2 is a simplified block circuit diagram of an embodiment of apparatus for controlling the speed of rotation of a fan motor in a development of the invention.
Figure 3A:
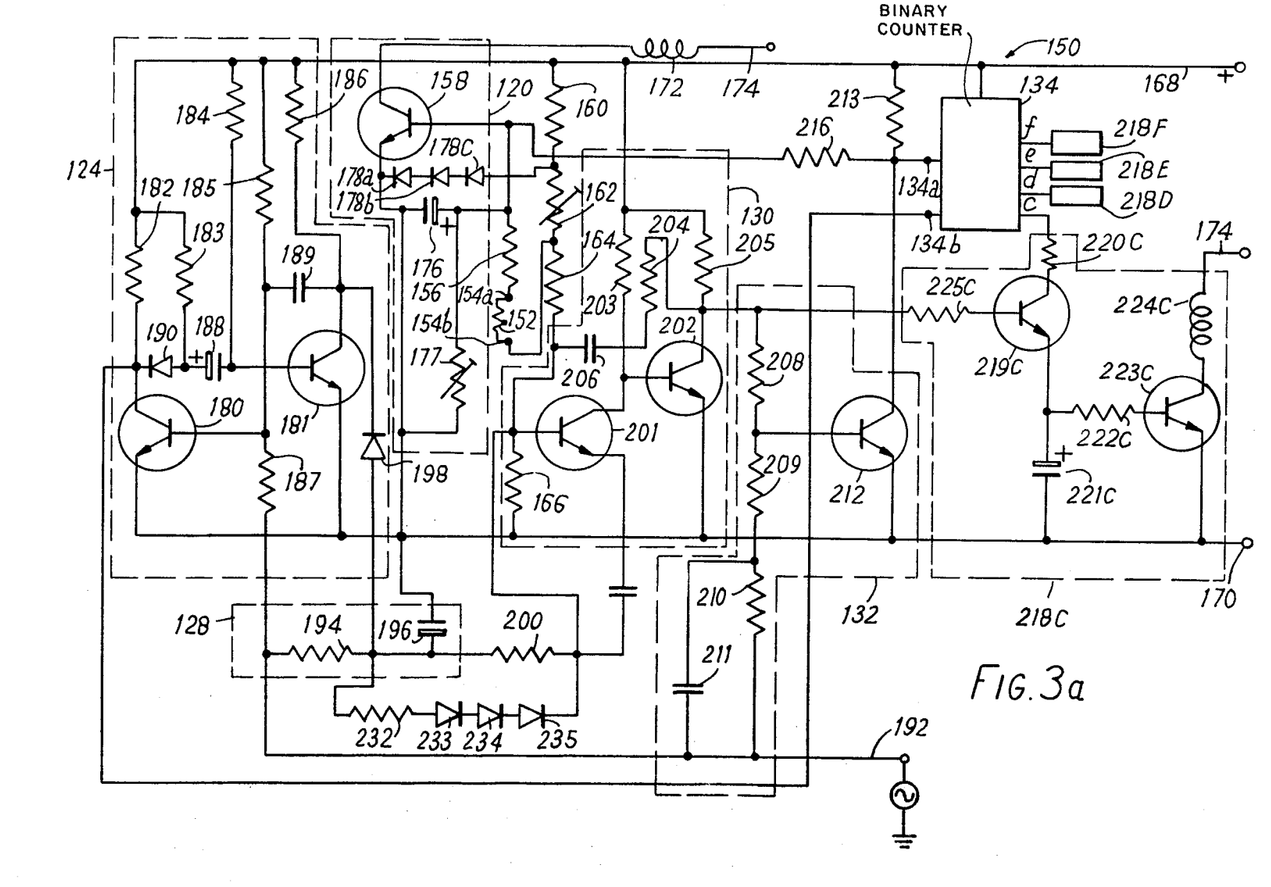
FIGS. 3a and b show a circuit diagram of another embodiment of apparatus for controlling the speed of rotation of a fan motor.
Figure 3B:
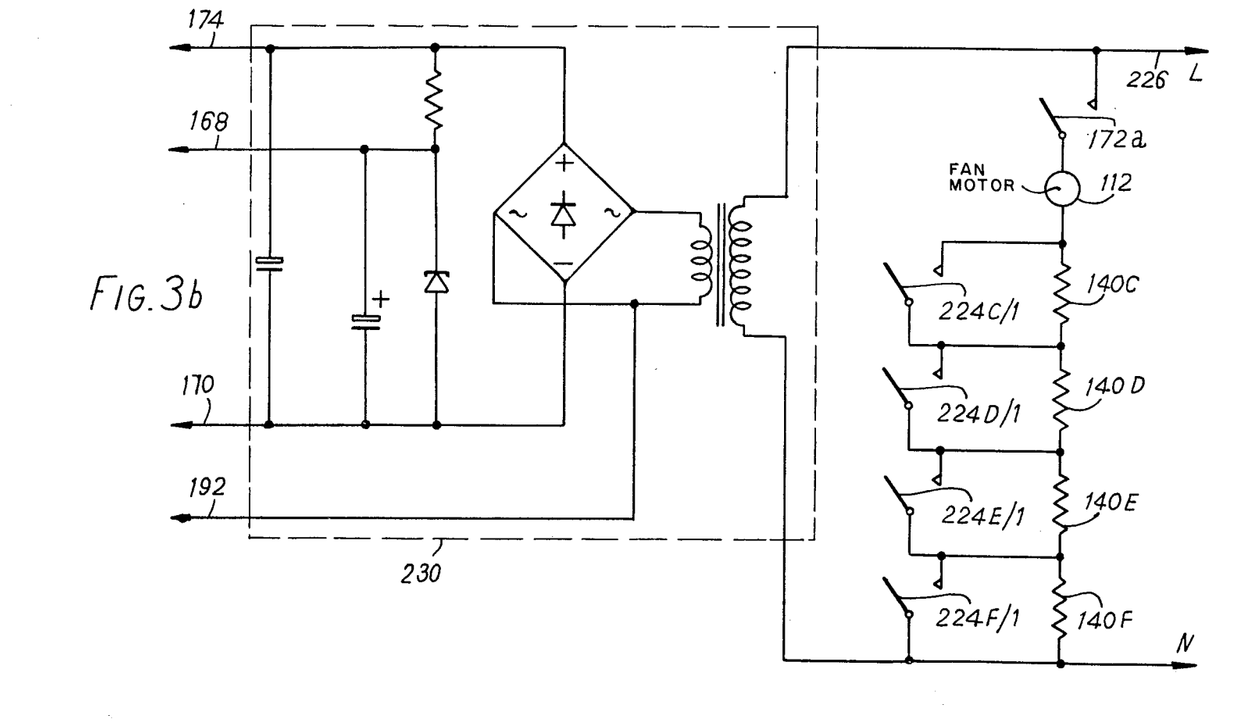

In FIGS. 2, 3a and 3b of the drawings, like parts are given like references.

Referring now to FIG. 2, there is shown apparatus 110 for controlling the speed of rotation of a fan motor 112 in dependence upon the magnitude of an input signal applied to an input terminal 114. The apparatus 110 comprises an analogue to digital (A to D) converter shown within a broken line 116, and having an input 118. The input terminal 114 is coupled through an amplifier 120 to the input 118. The input current for the circuit and applied to terminal 114 is derived from a thermistor (not shwon) situated in the air stream of the fan of the central-heating system and close to the heat exchanger (not shown).

The A to D converter 116 is arranged to convert an analogue signal applied to input 118 into a digital number representative of its magnitude.

The output of the A to D converter 116, in the form of a digital count, is coupled to a motor control means shown within a broken line 122 arranged periodically to decode the digital number and to control the speed of rotation of the motor 112 in dependence upon the magnitude thereof. Thus the speed of rotation of the motor 112 is dependent upon the magnitude of the analogue input signal.

A sample and reset timer 124 is arranged to generate at outputs 126a and 126b a sample and reset pulse 100 µs long every 10 secs. The reset pulse is used periodically to reset the A to D converter 116 to a datum level to start a fresh conversion of the input signal and, indirectly, to cause the motor control means to decode the output of the A to D converter 116 each time it has effected a conversion.

The A to D converter 116 comprises a staircase generator 128, typically a resistor and capacitor (not shown) coupled in series between signal ground and a source of alternating current, so that, in operation the potential across the capacitor increases in a stepwise fashion. The staircase generator 128 has a reset input 128a coupled to the output 126a of the sample and reset timer 124 and an output 128b coupled to one input 130a of a comparator circuit 130. Thus the generator 128 supplies to the comparator 130 a staircase waveform which is reset periodically to a datum level. The other input 130b of the comparator 130 is coupled to the input 118. The comparator 130 is a bistable device having an output set to one level when the magnitude of the signal at input 130b is greater than both a first predetermined value and the magnitude of the staircase waveform at input 130a and is reset to its other level when the magnitude of the staircase waveform is equal to or greater than the signal at input 118. The output 130c of comparator 130 is coupled to the control input 132a of a pulse generator 132 arranged to provide pulses to the input 134a of a 4-stage binary counter 134 when the comparator output is set to its said one level. Each stage of the counter 134 has a corresponding output 134c to 134f coupled to the motor control circuit 122. The outputs 134c to 134f of counter 134 correspond in known manner to counts of 1, 2, 4 and 8 respectively, that is the counter can count input pulses up to a maximum of 16 (that is, 0 and 1 to 15) and the dynamic range of the input signal is such that a full-house count of 15 in counter 134 would correspond to at least the maximum value of the input signal, and preferably a greater value.

The staircase generator 128 and counter 134 are reset to datum once every 10 seconds by a reset pulse applied to inputs 128a and 134b respectively.

The motor control circuit 122 comprises four identical latching circuits 136c to 136f coupled to counter outputs 134c to 134f respectively. The latching circuits 134c to 134f are arranged to control four normally-open switches 138c to 138f respectively which are connected in parallel with four corresponding resistors 140c to 140f connected in series between one terminal 112a of the motor 112 and the neutral terminal 142 of an alternating current supply for the motor 112. Thus closure of a switch will have the effect of shunting or short-circuiting its associated resistor. The values of the resistors 140c to 140f are binary weighted so that if the resistance of resistor 140c in parallel with switch 138c is R then the resistance of resistors 140d, 140e and 140f is respectively 2R, 4R and 8R. Thus the value of resistance in circuit is indirectly proportional to the count in the counter 134.

The other terminal 112b of the motor 122 is coupled through a normally-open switch 144 to the line terminal 145 of the alternating supply for the motor. Operation of the switch 144 is controlled by the output of the amplifier 120 such that when the magnitude of the output of the amplifier 120 is greater than a second predetermined value (which is typically less than the first predetermined value required to set the comparator 130) the switch 144 is closed so that an energising current flows in the motor 122. The magnitude of the current is determined, externally of the motor 112, by the sum of the resistors 140c to 140f in circuit.

In operation, the sample and reset timer 124 resets the output of the staircase generator 128 to its datum level and counter 134 to zero once every 10 seconds, and the motor control means 122 is arranged to control the speed of the motor 112 during any 10 second period according to the count in the counter 134 at the end of the immediately preceding 10 second period.

When the magnitude of an input current applied to terminal 114 is such that the output of the amplifier 120 is less than the said second predetermined value the motor is not energised. As the magnitude of the input signal is increased until the output of the amplifier 120 is equal to the second predetermined value the switch 144 is closed and the motor 112 is energized with all four resistors 140 in circuit so that the fan rotates at its lowest speed. If the magnitude of the input signal remains at a value between the second and the first, higher predetermined value the fan would continue to operate in this manner. When the input is increased still further until the output of amplifier 120 is equal to or greater than the first predetermined value and that of the staircase waveform the comparator 130 is set, to cause the pulse generator 132 to feed pulses to the counter 134. Assuming that the staircase generator 138 and counter 134 have just been reset, the counter will continue to count pulses until the magnitude of the staircase waveform becomes equal to or greater than the output of the amplifier 120 when the comparator 130 will be reset and thus inhibit the pulse generator. Thus it will be seen that the time interval during which the conparator 130 is set and therefore the number of pulses counted by the counter 134 will be dependent upon the magnitude of the input signal.

At the end of the analogue to digital conversion period the motor control means 122 decodes the count in the counter 134. This is achieved by coupling the reset signal from the output of the comparator 130 to an input of each of the latch circuits 136c to 136f in such a way that if an output stage of the counter 134 has changed state since the immediately preceding conversion the corresponding latching circuit is charged accordingly to open or close its associated switch 138. For example, if the count is six, the counter outputs 134c and f would be at zero and 134d and e would be at one so that switches 138c and f would be open and 138d and e closed to short out resistors 140d and e and the current through the motor would be increased accordingly to increase the speed of the motor and therefore the fan. Thus the speed of the fan is dependent upon the magnitude of the input signal.

At the next reset pulse the counter is reset to zero count, and staircase generator is reset to datum level. If the magnitude of the signal at the input 130b of the comparator 130 is still equal to or greater than the first predetermined value the comparator 130 is again set to cause pulses to be coupled until the magnitude of the staircase waveform again equals or exceeds that at the input 130b to reset the comparator 130. When the comparator 130 resets, its output also causes the latching circuits 136 to decrease the output of the counter to determine the speed of the motor 112 during the next succeeding conversion period and so on.

Thus the fan is stationary until the temperature at the heat exchanger reaches a predetermined value and then there is a 16-step control of the speed of the fan to maintain the room temperature substantially constant.

Referring now to FIGS. 3a and b there is shown a circuit diagram of apparatus 150 according to the invention for controlling the speed of rotation of a motor 112 arranged to drive a fan in a warm-air central heating system according to the resistance of a thermistor 152 situated in the air stream of the fan and close enough to the heat exchanger (not shown) to be responsive to heat radiated or convected therefrom.

The circuit is somewhat similar to that shown as a block diagram in FIG. 2 and parts of the circuit which generally correspond to a block in FIG. 2 are shown in outline by a broken line bearing the same reference although it will be appreciated that individual components may form part of more than one block.

The thermistor 152, which has a resistance characteristic which decreases with increase in temperature, is connected between input terminals 154a and 154b. Terminal 154a is coupled through a resistor 156 to the base of a NPN transistor 158. A chain of resistors 160, 162, 164 and 166 in series is connected between a +5 volt rail 168 and a zero volt rail 170 and the terminal 154b is connected to the junction of resistor 162 with resistor 164. The transistor 158 has its collector coupled through a relay coil 172 to a +30 volt rail 174, and its emitter connected to the zero volt rail 170. The relay coil 172 has a pair of normally-open contacts 172a connected between one input of the motor 112 and the line terminal 226 of an alternating current supply. A capacitor 176 is connected between the emitter and base of the transistor 158 and a variable resistor 177 is connected between the zero volt rail 170 and the junction of the capacitor 176 with the resistor 156. Three diodes 178a, 178b and 178c poled as shown are connected in series between the emitter of transistor 158 and the junction of resistor 160 with resistor 162 and operate as a voltage regulator with a negative temperature coefficient of resistance to compensate for changes in ambient temperature. Thus the transistor 158 and its associated components can be likened to the amplifier 120 of FIG. 2.

A sample and reset circuit shown within a broken line 124 is an astable multivibrator arranged to generate a pulse about 100 μ secs. long every 10 seconds. The multivibrator 124 comprises two NPN transistors 180 and 181, resistors 182 to 187, capacitors 188 and 189 and a diode 190 connected as shown. Pulses of 100 μ secs. duration and of opposite polarity appear at the collectors of the two transistors 180 and 181. The resistor 187 has one end coupled to the base of transistor 180 and through resistor 185 to the +5 volt line, and the other end to a 24 volt a.c. rail 192 thereby to synchronise the operation of the multivibrator 124 to a predetermined point on the waveform of the line frequency.

A staircase generator shown within a broken line 128 comprises a resistor 194 and a capacitor 196 connected in series between the 24 volt a.c. rail 192 and the zero volt rail 170. The junction of the resistor 194 and capacitor 196 is coupled to the collector of transistor 181 by way of diode 198 so that the capacitor is discharged to a datum level (substantially zero volts) once every 10 seconds by a reset pulse. The end of the resistor 194 remote from the capacitor is connected to the 24 volt a.c. rail 192 so that the capacitor is charged in stepwise fashion by the positive half cycles of alternating current to generate a staircase output waveform.

The output of the staircase generator 128 is coupled by way of a resistor 200 to the input of a bistable circuit shown within a broken line 130. The bistable circuit 130 comprises two NPN transistors 201, 202 the resistor 166, resistors 203, 204 and 205 and a capacitor 206, the input of the circuit 130 being the base of transistor 201.

The bias voltage at the junction of resistors 162 and 164 is dependent upon the resistance of thermistor 152 and hence temperature of the air stream near the heat exchanger. When the resistance of the thermistor 152 is high, that is the temperature is low, the bias voltage is such that the transistor 201 is ON, that is conducting and transistor 202 is OFF, that is substantially non-conducting. When the thermistor resistance falls to a first predetermined value or lower, the bias voltage increases in a negative direction and, assuming the capacitor 196 is discharged or nearly so, the transistor 201 is turned OFF and transistor 202 is turned ON so that the bistable is set to one state. Then, as the magnitude of the staircase waveform increases it will eventually reach a value at which it offsets the change in the bias at the base of transistor 201 due to the change in resistance of thermistor 152 so as to turn ON transistor 201 and turn OFF transistor 202 to reset the bistable circuit 130. Thus the bistable 130 will be set for a time dependent upon the magnitude of the change in the bias level due to change in the resistance of the thermistor 152. The bistable circuit 130 can therefore be likened to the comparator 130 of FIG. 2.

A chain of resistors 208, 209 and 210 is coupled between the collector of transistor 202 and the 24 volt a.c. rail 192, a capacitor 211 being connected in parallel with resistor 210. A NPN transistor 212 has its base connected to the junction of resistor 208 with resistor 209, its emitter connected to the zero volt rail 170 and its collector coupled through a resistor 213 to the +5 volt rail 168. Thus part of the circuit is so arranged that when transistor 202 is OFF the bias voltage at the base of transistor 212 is sufficient to ensure that transistor 212 is conducting continuously, that is, it is ON. When transistor 202 is switched ON the bias at the base of transistor 212 is removed and the positive half cycles of alternating voltage from line 192 are sufficient to switch transistor 212 ON and OFF at line frequency. Thus transistor 212 and its associated circuitry within a broken line 132 can be regarded as a pulse generator operative when the bistable circuit 130 is set.

The output of the pulse generator 132, the collector of transistor 212, is connected to the clock input 134a of an integrated circuit, four stage, divide by 16 binary counter 134. The collector of transistor 212 is also coupled to the base of transistor 158 by a resistor 216 for a purpose to be described hereinafter.

The counter 134 also has a reset input 134b coupled to the collector transistor 180 in the reset timer 124, whereby the counter is reset to zero every 10 seconds.

The outputs of the four stages 134c to 134f corresponding to the first stage of the counter 134 are connected to four identical latching circuits 218 C to F of which only one circuit 218 C is shown in detail.

Each of the latching circuits 218 includes components like those illustrated in circuit 218c which; comprises a NPN transistor 219c having its collector coupled through a resistor 220c to the output of its corresponding counter stage, and its emitter coupled through a capacitor 221c to the zero volt line 170 and through a resistor 222c to the base of a power NPN transistor 223c. The emitter of transistor 223c is connected to the zero volt rail 170 and the collector is coupled through a relay coil 224c to the +30 volt rail 174. The base of transistor 219c is coupled through a resistor 225c to the collector of transistor 202, and the circuit is so arranged that the transistor 219c are maintained non-conducting when transistor 202 is ON and pulses are being counted by the counter 134. When the bistable circuit 130 is reset so that transistor 202 is switched OFF, the bias levels at the bases of the transistors 219c is such that the transistors 219c can conduct to decode the output 0 to 1 of their corresponding counter stages and energise of de-energise relay 224c depending upon the count in the stage. If the count in the counter stage is 0 the relay is not energised and if the count is 1 the relay is energised and this state is maintained until after the bistable circuit 130 has been set and reset once more, that is until the next succeeding conversion of the analogue input signal to a digital representative in the counter.

One side of the motor 112 is coupled through a normally-open relay contact 172a, actuated by relay 172, to the line terminal 226 of the alternating current mains supply and the other side is coupled through four binary weighted resistors 140C to 140F to the neutral terminal 228. The resistors 140C, 140D, 140E and 140F have resistance values of R, 2R, 4R and 8R respectively. Connected in parallel with each of the resistors 140C to 140F is an associated normally-open relay contact 224C/1 to 224F/1 respectively, each relay contact being actuated by its corresponding relay coil 224.

The power supply for the circuit 150 is shown within a broken line 230.

In operation, when the central heating system is switched-on the heat exchanger will be cold and the resistance of the thermistor 152 high. The fan motor should not be operative as cold air would be circulated to the spaces to be heated.

The staircase generator 128 will operate continuously, generating a staircase waveform which is reset to zero once every 10 seconds by a reset pulse from the sample and reset timer 124. The bistable circuit 130 will be reset with transistor 201 ON and transistor 202 OFF so that the generation of pulses to the counter 134 is inhibited, and the count is zero.

When the thermistor 152 is cool, its resistance will be high and the potential at the junction of resistors 162 and 164 will be high so that sufficient current will flow through resistor 164 to the base of transistor 201 to ensure that transistor 201 is maintained ON even when the capacitor 196 is discharged to substantially zero volts by timer 124.

As the temperature at the thermistor increases, its resistance falls until the bias level at the base of transistor 158 is sufficient to turn it ON, and the resulting collector current energises relay 172 to close the normally-open contacts 172a in the power supply to the fan motor 112. As the contacts 224 are open all of the resistors 140 will be in circuit and the fan motor will rotate at its slowest speed to provide some air flow. This occurs when the temperature at the thermistor is about 50° C.

As the temperature at the thermistor 152 increases the bias voltage at the junction of resistors 162 and 164 reduces. When the temperature at the thermistor is at a value about 55° C, the bias is reduced to a level such that when the capacitor 196 is next discharged by a reset pulse, the transistor 201 is turned OFF and transistor 202 is consequently turned ON, that is the bistable circuit 130 is SET. The resistor 204 and capacitor 206 are "speed-up" components selected to ensure a rapid transition between operative states of the circuit 130.

The bistable circuit 130 remains in the set state until the potential across the capacitor 196 has been increased in stepwise fashion by positive half cycles of alternating current on rail 192 to a value at which it is sufficient to offset the change in bias at the base of transistor 201 due to the change of resistance of the thermistor 152. At this time the transistor 201 is switched ON again and transistor 202 is switched OFF, to reset the circuit 130. Thus the circuit 130 will be set for a period dependent upon the magnitude of the change in resistance of the thermistor. If the thermistor is heated to a value at which its change in resistance is just sufficient to switch OFF transistor 201, then the circuit 130 will be set for only a short time. If the thermistor 152 is heated to a much higher value then the circuit 130 will be set for a correspondingly longer time. Thus the combination of circuits 120, 124, 128 and 130 can be regarded as an analogue input to time duration converter.

For the duration of the time that the circuit 130 is set, transistor 202 is ON and the resulting reduction in potential at its collector is such that positive half cycles of alternating voltage on rail 192 can turn transistor 212 ON and OFF at the frequency of the a.c. mains supply. The circuit 132 including transistor 212 is arranged to shape the waveform appearing at the collector to a substantially square wave which is then coupled to the clock input 134b of the counter 134. The values of resistors 209 and 210 are selected to present a suitable value of alternating current to transistor 212 and the capacitor 211 is provided as a "speed-up" component to increase the rate of rise of the waveform.

The resistor 216 is provided to ensure that if a clock pulse is applied to counter 134 prior to switch 172a being closed, then amplifier 120 receives a small pulse to energise relay coil 172 and therefore close switch 172a.

At the end of a conversion period when the transistor 202 is turned OFF, the count in the counter 134 will be dependent upon the length of time the circuit 130 was set and hence on the magnitude of the temperature at the thermistor 152. Being a 4-stage converter the number of pulses counted during a conversion period can have any one of sixteen values, zero to fifteen.

The outputs 134c, 134d, 134e and 134f of the counter 134, corresponding to counts of 1, 2, 4 and 8 respectively are decoded by the latching circuits 218C to 218F which actuate relay contacts 218C/1 to 218F/1 accordingly to adjust the power supplied to the motor 112.

Each base resistor 225 of the latch circuits 218 is connected to the collector of transistor 202 so that when transistor 202 is ON to cause clock pulses to be counted, the transistors 219 are cut-off. At the end of a conversion, transistor 202 is turned OFF and allows the transistors 219 to sample their corresponding counter output stages. If a counter stage has changed its state in the immediately preceding conversion period its associated latch circuit changes state accordingly to energise or de-energise its relay as the case may be. The latch circuits 218 are then maintained in that state until they take a fresh count sample at the end of the next succeeding conversion period.

By selecting the resistors 140C to 140F to have a binary relationship to each other it is thus possible to convert the binary number in the counter to a decimal value of resistance and thus to vary the voltage to the fan in regular steps accordingly to the count in the counter. The air flow caused by the fan will thus be increased or decreased with increase or decrease in temperature at the thermistor thus tending to stabilise the temperature.

Connected in parallel with the resistor 200 is a series circuit comprising a resistor 232 and three diodes 233, 234, and 235 poled as shown which introduce a nonlinearity into the control system which tends to compensate the non-linear voltage against speed relationship of the motor.

Various modifications can, of course, be made to the circuit without departing from the scope of the invention. For example, the binary-weighted resistors 140 could be replaced by four binary-weighted voltages derived from separate windings of a transformer.

As the whole process is directly geared to a specific point on the supply waveform, the switches 224C/1, 224D/1, 224E/1 and 224F/1 will open at, or near to, the zero voltage point on the supply waveform to minimise sparking (interference) and prolong the life of the switches.

Figure 4:
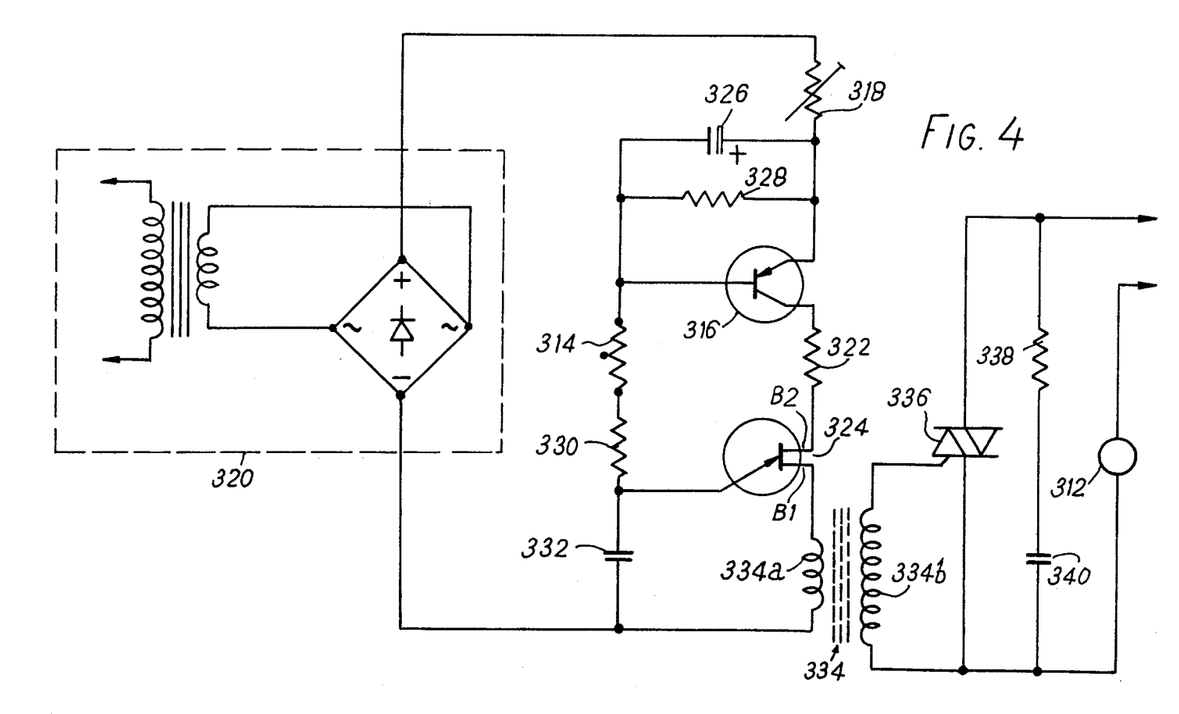
Fig. 4 is a circuit diagram of another embodiment of apparatus for controlling the speed of rotation of a fan motor.

Referring now to FIG. 4 there is shown a circuit diagram of apparatus 310 for controlling the speed of an electric motor 312 in accordance with the value of resistance of a resistor 314. As described with reference to FIG. 3 the motor 312 is arranged to drive a fan in a warm-air central heating system and the resistor 314 is a thermistor situated in the air stream and in a position to receive radiant heat from the heat exchanger.

The apparatus 310 comprises a PNP transistor 316 having its emitter coupled through a preset resistor 318 to a +24 volts unsmoothed line of a power supply 320 and its collector coupled through a resistor 322 to base 2 of a unijunction transistor 324. A capacitor 326 and resistor 328 are connected in parallel between the base and emitter of transistor 316. The base of the transistor 316 is coupled to the emitter of the unijunction transistor 324 by way of the thermistor 314 and a resistor 330, and the emitter of the unijunction transistor 324 is further coupled to the zero volt line of the power supply 320 through a capacitor 332. The base 1 of the unijunction transistor 324 is coupled through the primary winding 334a of a pulse transformer 334. The transformer is wound on a ferrite core and has a ratio of 1:1.

One end of the secondary winding 334b of the transformer 334 is coupled through the motor 312 to one side of the alternating current supply. The other end of the secondary winding 334b of the transformer 334 is coupled to the gate electrode of a thyristor or triac 336 which is connected between the motor 312 and the other side of the alternating current supply. A surge suppression circuit comprising a resistor 338 and a capacitor 340 are connected in series across the thyristor or triac 336 to protect the thyristor or triac, and reduce radio frequency interference.

In operation, when the temperature at the thermistor 314 is low, the thermistor resistance is high and the circuit is non-oscillatory. As the temperature increases so that the thermistor resistance decreases the transistor 316 will start to conduct at a predetermined value of the thermistor resistance set by resistor 328, and current will flow through resistor 322 to base 2 of the unijunction transistor 324. Current will also flow by way of thermistor 314 and resistor 330 to the emitter of the unijunction transistor 324 so that the transistor 324 starts to oscillate at a rate determined by the capacitor 332. The frequency of oscillation is about 1KHz. The oscillator waveform is developed across the primary winding 334a of the 1:1 transformer 334 which both shapes the pulses and provides isolation from the a.c. mains potential at the secondary winding 334b. The potential developed across the secondary winding 334b is fed to the gate of the triac 336. The triac 336 is thus fired by the oscillator pulses and, depending upon the point on the 50Hz mains cycle on which it is fired, provides a proportional amount of power to energise the motor 312. For example if the triac 336 is fired on the peaks of the a.c. waveform power will be fed to the motor 312 for two quarter cycles in each cycle and the motor will be energised effectively at half power.

The triac can be fired at any point of the 50Hz a.c. waveform and as a result the power fed to the motor will be varied proportionately. During normal operation, as the resistance of the thermistor varies, the firing point of transistor 324 on the a.c. waveform which appears as ripple on the +24 volt supply varies, up to a maximum allowed by the value of resistor 318. The resistor 318 can be preset to adjust the maximum power to and the speed of, the motor 312. The resistor 322 is provided to limit the current through transistor 324 in the event that the resistor 318 is set to zero ohms.

The transistor 316 ensures a rapid escalation of power at the commencement of oscillation, to ensure that the motor 312 does not receive power at too low a level which is inadequate to cause the motor to run. If that happens overheating and eventual failure of the motor would occur.

The resistor 330 is provided to prevent the unijunction transistor 324 from "locking-on" in the event that the resistance of the thermistor 314 is reduced to a very low value.

I claim:

1. An electrical circuit having three states depending upon the magnitude of an input electrical signal coupled, in operation, to an input thereof, the circuit comprising an input for receiving the input signal and an output, and having a first stable state when the said magnitude of said input signal is less than a first, predetermined value, a second, stable state when the said magnitude is greater than a second, predetermined value higher than the first said predetermined value, and a third, unstable state when said magnitude is equal to or between said first and second predetermined values, said circuit including a semi-conductor device having an input electrode, means for coupling the input signal to said input electrode such that said device is arranged to conduct current continuously in one of its stable states, to be substantially non-conductive in the other of its stable states and to oscillate between a conductive state and a substantially non-conductive state in its third, unstable state, said circuit being so arranged that when it is in the third, unstable state the ratio of the time it is in the conductive state to the time it is in the substantially non-conductive state is dependent upon the magnitude of the input electrical signal, said circuit comprising two transistors of opposite conductivity type, a feedback network, means coupling the collector of the first transistor to the base of the second transistor and means coupling the collector of the second transistor to the base of the first transistor by way of said feedback network which is arranged to determine the period of oscillation of the circuit when it is in the third, unstable state.

2. Control apparatus for controlling the amount of heat generated by a gas heater according to the temperature of an object or a space to be heated, the apparatus comprising a tri-state circuit according to claim 1, a gas control means having an output for controlling the supply of gas to a burner, and an input coupled to the output of said tri-state circuit, means for monitoring the said temperature and for providing an input signal to said input of said tri-state circuit of such magnitude that when the temperature is less than a first predetermined value said tri-state circuit causes said gas control means to supply gas continuously to the burner, when the temperature is more than a second predetermined value higher than the first said predetermined value, said circuit causes said gas control means to stop the supply of gas to said burner, and when the temperature is equal to or between the said two predetermined values, said circuit causes the gas control means to supply gas to said burner intermittently and at a rate dependent upon the magnitude of the temperature.

3. Control apparatus according to claim 2, in which the means for monitoring the temperature is a device, such as a thermistor, the resistance of which varies with temperature, or a thermocouple, the output voltage of which varies with temperature.

4. Control apparatus according to claim 2 arranged to control the amount of heat generated in a central-heating system in which said means for monitoring the temperature is arranged to monitor the ambient temperature of a space to be heated.

5. Control apparatus according to claim 4 in a warm-air central-heating system further comprising a heat exchanger, ducts for the conveyance of heated air and means for directing air to be heated over said heat exchanger and then through said ducts to be discharged into a space or spaces to be heated.

6. Control apparatus according to claim 5, in which the said means for directing air comprises a fan.

7. Control apparatus according to claim 6, comprising means for controlling the speed of said fan motor to control the volume of air passed over the heat exchanger and delivered to the space or spaces to be heated in dependence upon the temperature at a predetermined position in the system, thereby to maintain the temperature in the space, or spaces substantially constant.

8. Control apparatus according to claim 7 in which said means for controlling the speed of rotation of said fan motor in dependence upon the magnitude of a temperature at a predetermined position in the system comprises an analogue to digital converter having an input for receiving an analogue input signal dependent on the temperature and an output and a motor control means having an input coupled to said output of said converter and an output, said motor control means being arranged, in operation, periodically to decode the digital output of the converter and to provide an output signal to control the speed of rotation of said motor in dependence thereon.

9. Control apparatus according to claim 8, further comprising means for periodically resetting the output of said analogue to digital converter to a datum value and for inhibiting change in operation of said motor control means during a conversion period.

10. Control apparatus according to claim 8 in which the analogue to digital converter comprises an analogue to time interval converter arranged to generate an output signal having a time duration dependent upon the magnitude of the input signal, a counter and pulse generator means coupled to the output of said analogue to time interval converter for causing pulses to be counted by said counter for the duration of said output signal.

11. Control apparatus according to claim 10 in which said analogue to time interval converter comprises a ramp generator for generating a ramp output signal which varies at a substantially constant rate during a conversion period and means for comparing the magnitudes of the ramp output signal and the input signal, or a signal derived from the input signal, and for generating a comparison signal when the two compared signals balance out, and said means coupled to the output of said analogue to time interval converter is arranged to cause pulses to be counted during a time interval starting when said ramp signal is equal to a datum value and terminating with the generation of the comparison signal.

12. Control apparatus according to claim 11 in which said ramp generator is a staircase generator.

13. Control apparatus according to claim 12 in which said staircase generator comprises a resistor and capacitor connected in series to a source of a.c. potential whereby the potential across the capacitor increases in a stepwise fashion as it is charged by alternate half cycles of current from the a.c. source.

14. Control apparatus according to claim 13 in which means is provided for discharging said capacitor to a datum level at the start of each conversion period.

15. Control apparatus according to claim 11 in which said means for comparing is a bistable circuit arranged to be set to one state at the start of a conversion period and to be reset by the comparison signal.

16. Control apparatus according to claim 8 in which said motor control means comprises a plurality of latching circuits coupled to the outputs of said counter and arranged to vary the energisation to said electric motor according to the weighting of its associated counter stage.

17. Control apparatus according to claim 16, in which the counter is a four-stage binary counter in which the four outputs thereof are representative of counts 1, 2, 4 and 8 respectively and the associated latching circuits are arranged to vary the power supplied to said motor by corresponding amount.

18. Control apparatus according to claim 17 comprising four resistors having weightings R, 2R, 4R and 8R connected in series with the alternating current supply to said motor and in which said latching circuits are arranged to short circuit said resistors of weighting R, 2R, 4R and 8R when the counter has a count representative of 1, 2, 4 and 8 respectively, or any combination thereof.

19. Control apparatus according to claim 18 in which each said resistor has a normally-open relay contact connected across it, and the relay contacts are controlled by relay coils energised by the corresponding latching circuits.

20. Control apparatus according to claim 16 in which the motor control means further includes means responsive to the input signal for inhibiting operation of the motor when the magnitude of the input signal is less than a predetermined value.

21. Control apparatus according to claim 11 in which said motor control means comprises a plurality of latching circuits coupled to the outputs of said counter and arranged to vary the energisation to said electric motor according to the weighting of its associated counter stage.

22. A circuit according to claim 1 having an output for connection to a load, such as a relay, which is arranged, in operation, to be energised continuously and de-energised when the circuit is in one and the other of the first and second states respectively, and to be energised intermittently when the circuit is in the third state.

23. A circuit according to claim 1, wherein the circuit is so arranged that both transistors are not completely saturated when in the conductive state.

24. A circuit according to claim 1 comprising a load, such as a relay, coupled between the collector of the second transistor and its collector supply voltage.

25. A circuit according to claim 1 in which the input of the circuit is the base of the first transistor.

26. A circuit according to claim 25 comprising a first NPN transistor and a second PNP transistor and in which the input signal is a d.c. voltage and said means for coupling the input signal to the base of the first transistor comprises a resistor, the arrangement being such that both transistors will be "on" when the magnitude of the input voltage is greater than a first predetermined value and both transistors will be "off" when the magnitude is less than a second predetermined value lower than the first said value, and when the magnitude of the input voltage is equal to or between the first and second predetermined values the transistors are switched "on" and "off" continuously.

27. A circuit according to claim 1, in which the feedback network between the collector of the second transistor and the base of the first transistor comprises a capacitor and resistor in series having values which determine the period of oscillation in the third state of the circuit.

28. A circuit according to claim 27 in which the said values of the feedback resistor and capacitor are such that the mark-space ratio (ratio of the length of time the transistors are "on" to the length of time the transistors are "off") of the circuit in the third state is dependent upon the magnitude of the input voltage, increasing as the said magnitude increases.

29. A circuit according to claim 28 in which the feedback network comprises a further circuit, such as a second capacitance-resistance circuit in parallel with the first mentioned capacitance-resistance circuit, to supplement said first feedback circuit when the input voltage is equal to or between the first and second predetermined values to ensure that the circuit remains in its unstable state at the two extremes of the controlled state of oscillation.

30. A circuit according to claim 26 in which the feedback network between the collector of the second transistor and the base of the first transistor comprises a capacitor and resistor in series having values which determine the period of oscillation in the third state of the circuit.

31. A circuit according to claim 30 in which the said values of the feedback resistor and capacitor are such that the mark-space ratio (ratio of the length of time the transistors are "on" to the length of time the transistors are "off") of the circuit in the third state is dependent upon the magnitude of the input voltage, increasing as the said magnitude increases.

32. A circuit according to claim 31 in which the feedback network comprises a further circuit, such as a second capacitance-resistance circuit in parallel with the first mentioned capacitance-resistance circuit, to supplement said first feedback circuit when the input voltage is equal to or between the first and second predetermined values to ensure that the circuit remains in its unstable state at the two extremes of the controlled state of oscillation.

33. A central-heating system comprising control apparatus according to claim 8.

* * * * *